United States Patent
George et al.

(10) Patent No.: US 12,525,536 B2
(45) Date of Patent: Jan. 13, 2026

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Tom George, Boise, ID (US); Rita J. Klein, Boise, ID (US); Daniel Billingsley, Meridian, ID (US); Pengyuan Zheng, Boise, ID (US); Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 454 days.

(21) Appl. No.: 17/900,064

(22) Filed: Aug. 31, 2022

(65) Prior Publication Data
US 2024/0071931 A1    Feb. 29, 2024

(51) Int. Cl.
*H01L 23/535* (2006.01)
*H01L 23/532* (2006.01)
(Continued)

(52) U.S. Cl.
CPC .......... *H01L 23/535* (2013.01); *H10B 41/27* (2023.02); *H10B 43/27* (2023.02)

(58) Field of Classification Search
CPC . H01L 23/53266; H01L 23/535; H10B 41/27; H10B 43/10; H10B 43/27; H10B 43/50
See application file for complete search history.

(56) References Cited

U.S. PATENT DOCUMENTS

2014/0349455 A1* 11/2014 Ahn ............... H10B 43/35
                                                       438/269
2015/0228651 A1   8/2015 Yen et al.
(Continued)

OTHER PUBLICATIONS

Hu et al., U.S. Appl. No. 17/971,443, filed Oct. 21, 2022, titled "Memory Arrays Comprising Strings Of Memory Cells And Methods Used In Forming A Memory Array Comprising Strings Of Memory Cells", 48 pages.

*Primary Examiner* — Omar F Mojaddedi
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers above a conductor tier. Strings of memory cells comprising channel-material strings extend through the insulative tiers and the conductive tiers. The conductor tier comprises upper conductor material directly above and directly against lower conductor material of different composition from that of the upper conductor material. A through-array-via (TAV) region is included and comprises TAVs individually comprising the upper conductor material, the lower conductor material, and a conducting material that is directly below the conductor tier. The lower conductor material is directly against the conducting material and comprises at least one of (a) and (b), where, (a): a metal-rich refractory metal nitride; and (b): a stoichiometric or non-stoichiometric refractory metal nitride directly above and directly against one of (1), (2), or (3), where: (1): an elemental metal; (2): an alloy of at least two elemental metals; and (3): a metal-rich refractory metal nitride of different composition from that of the stoichiometric or non-stoichiometric refractory metal nitride. Methods are also disclosed.

42 Claims, 15 Drawing Sheets

(51) Int. Cl.
  *H10B 41/27*  (2023.01)
  *H10B 43/10*  (2023.01)
  *H10B 43/27*  (2023.01)
  *H10B 43/50*  (2023.01)

(56) References Cited

U.S. PATENT DOCUMENTS

| | | |
|---|---|---|
| 2017/0117290 A1 | 4/2017 | Lee et al. |
| 2018/0047739 A1* | 2/2018 | Dorhout ................. H10B 41/10 |
| 2020/0168622 A1* | 5/2020 | Fukuzumi ............... H10B 43/10 |
| 2020/0279855 A1* | 9/2020 | Tran ....................... H10B 41/27 |
| 2020/0295031 A1* | 9/2020 | Lue ........................ H10B 43/27 |
| 2021/0066460 A1 | 3/2021 | Haller |
| 2021/0175248 A1* | 6/2021 | Haller .................... H10B 41/35 |
| 2021/0257301 A1* | 8/2021 | Matsumoto ......... H01L 23/5226 |
| 2023/0039511 A1* | 2/2023 | Min ....................... H10B 43/40 |
| 2023/0081495 A1* | 3/2023 | Cho ....................... H10B 43/35 |
| | | 257/326 |
| 2024/0071498 A1 | 2/2024 | Hu et al. |
| 2024/0215244 A1* | 6/2024 | Tanaka ................... H10B 43/27 |

* cited by examiner

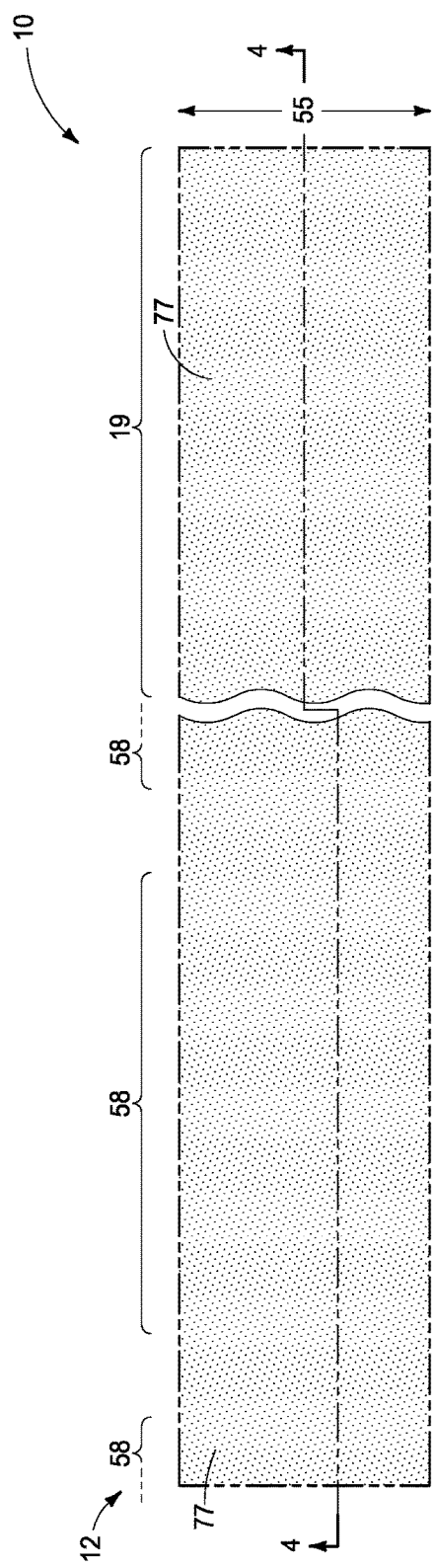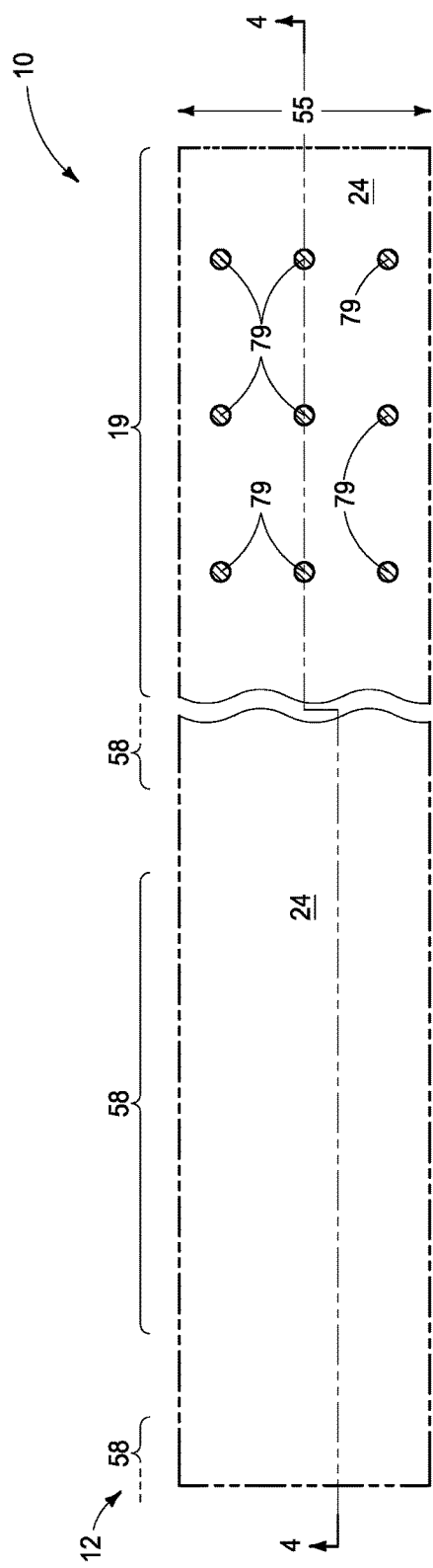

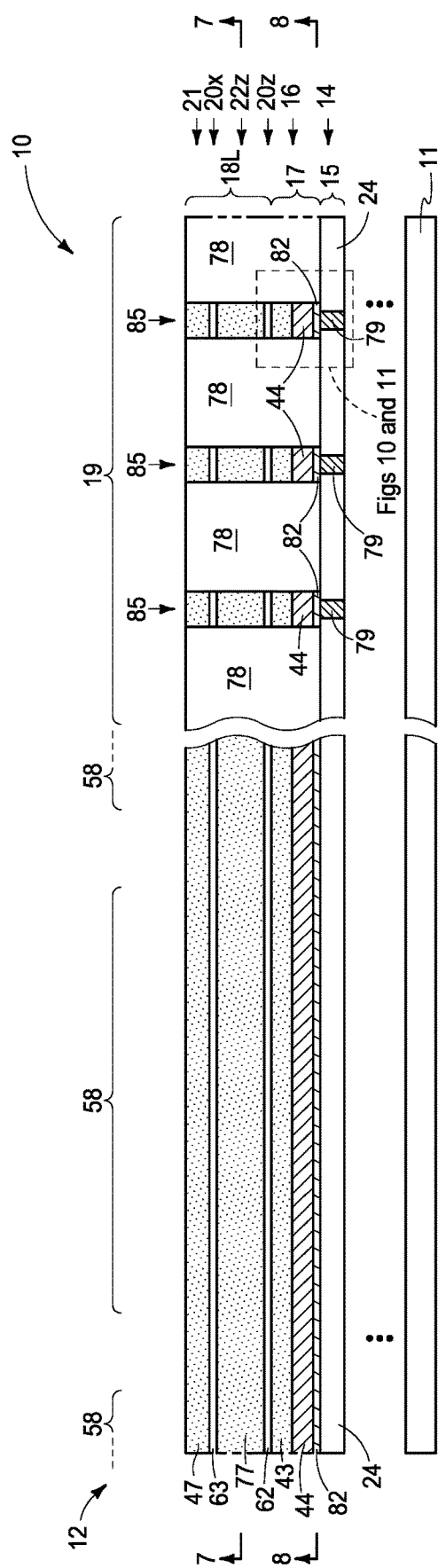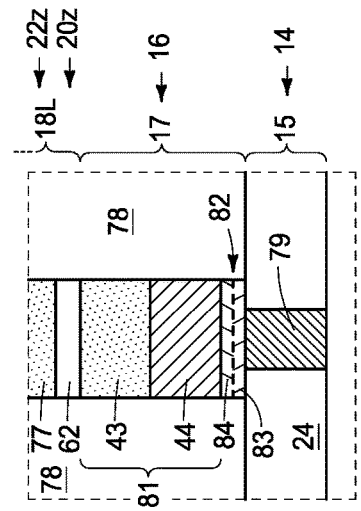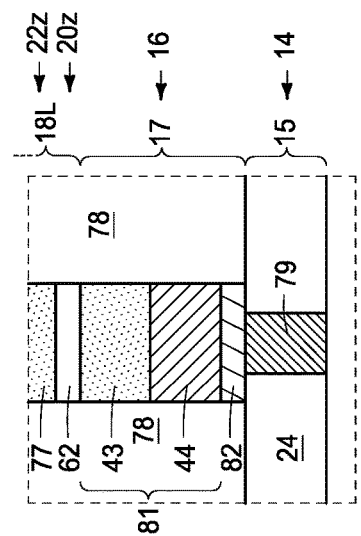

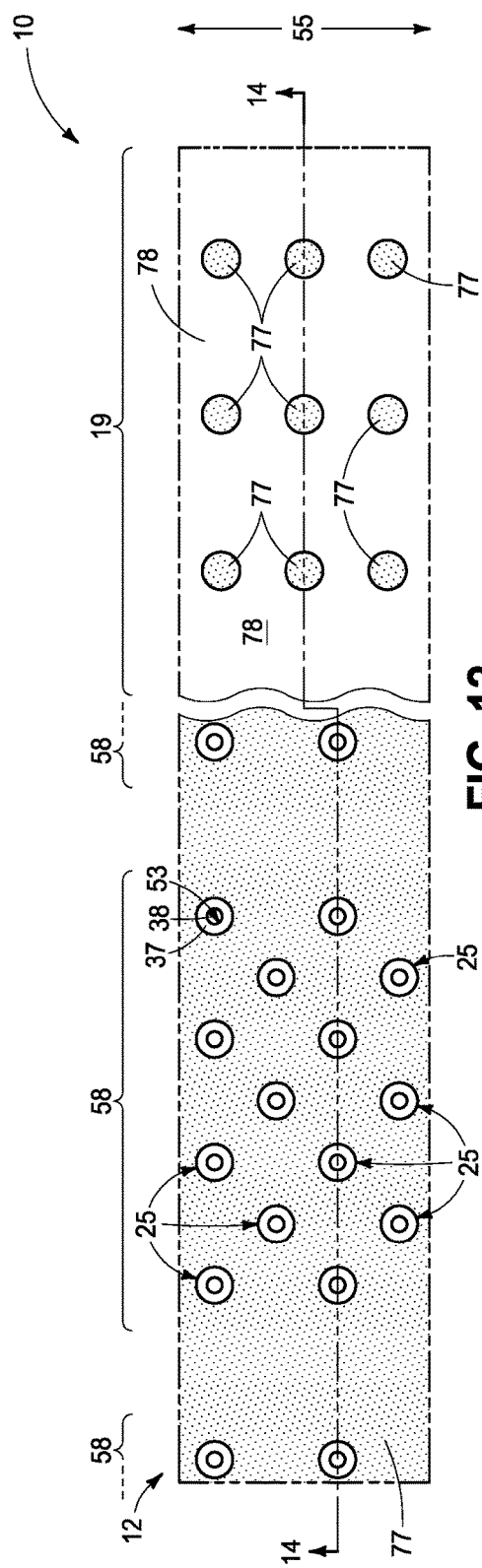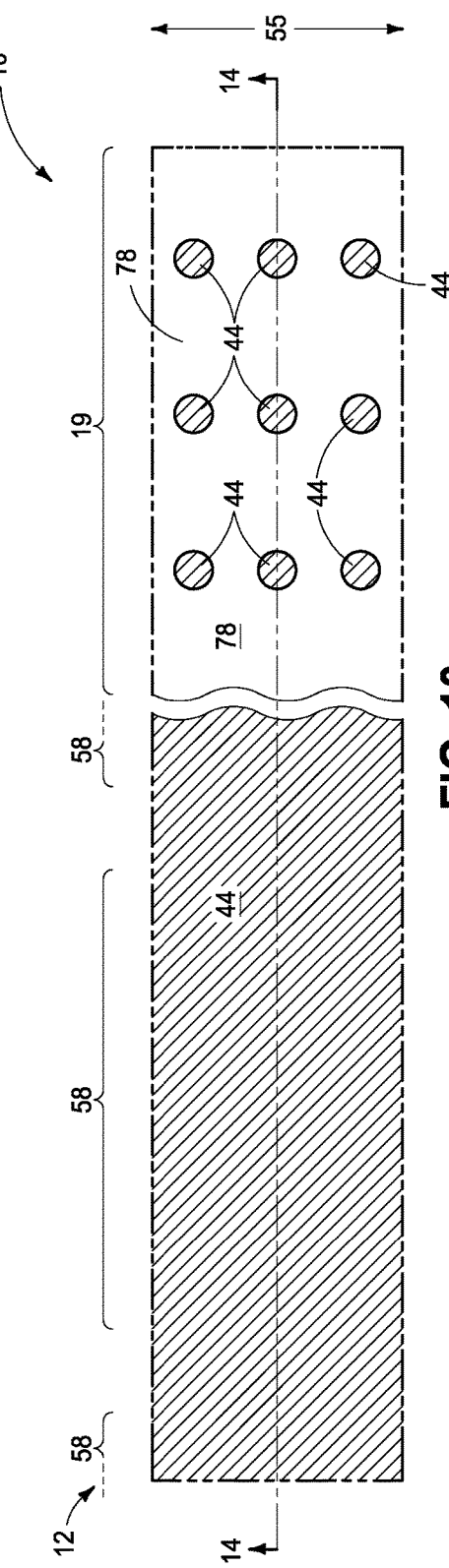

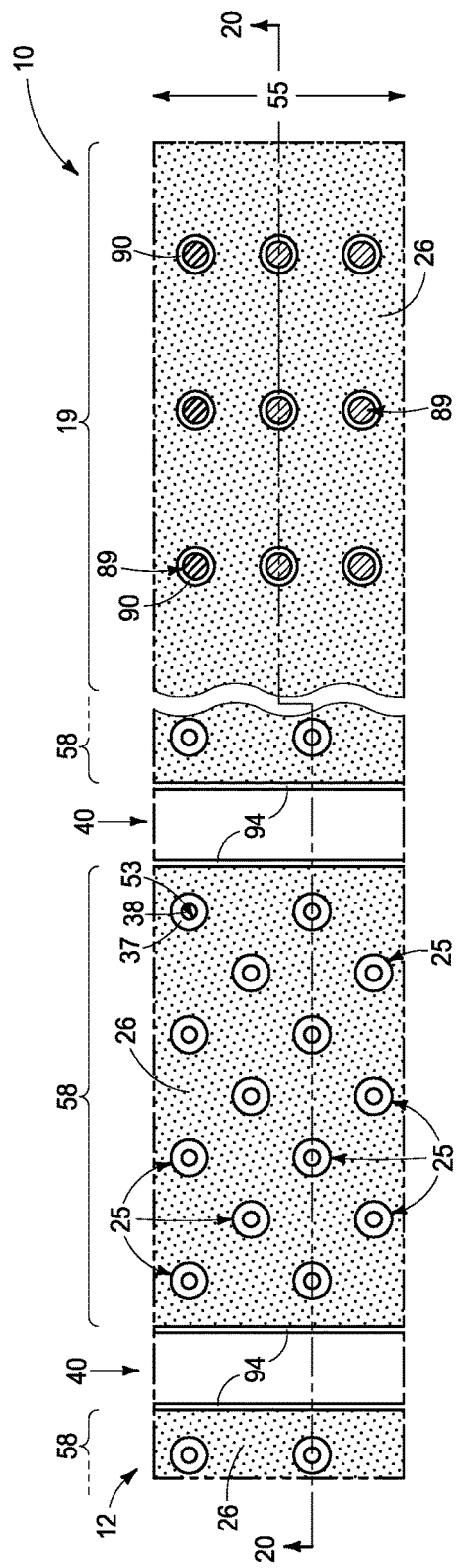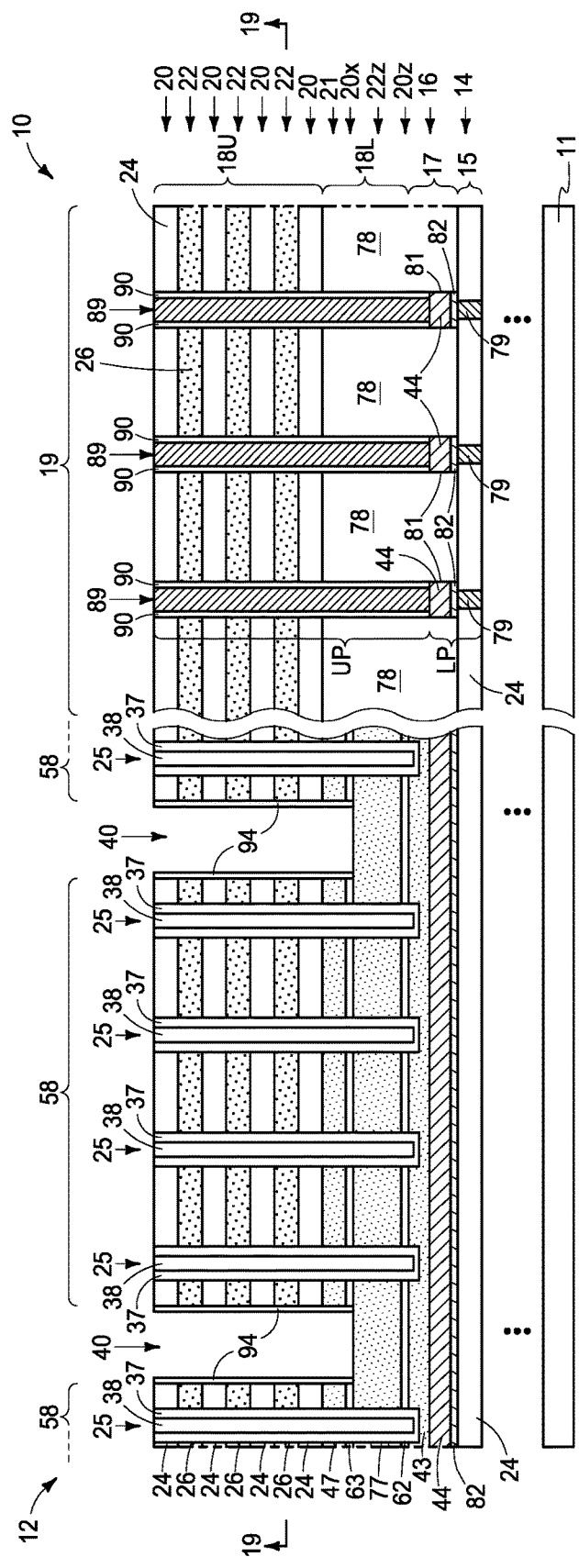
FIG. 19
FIG. 20

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 2-4 are enlarged diagrammatic cross-section views of portions of FIG. 1 in process in accordance with an embodiment of the invention.

FIGS. 5-30 are diagrammatic sequential sectional and/or enlarged views of the construction of FIGS. 1-4, or portions thereof, or alternate and/or additional embodiments, in process in accordance with some embodiments of the invention.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-30 which may be considered as a "gate-last" or "replacement-gate" process. Further, and regardless, the following sequence of processing steps is but one example and other sequences of the example processing steps (with or without other processing steps) may be used regardless of whether using "gate-last/replacement-gate" processing.

Figure 1:
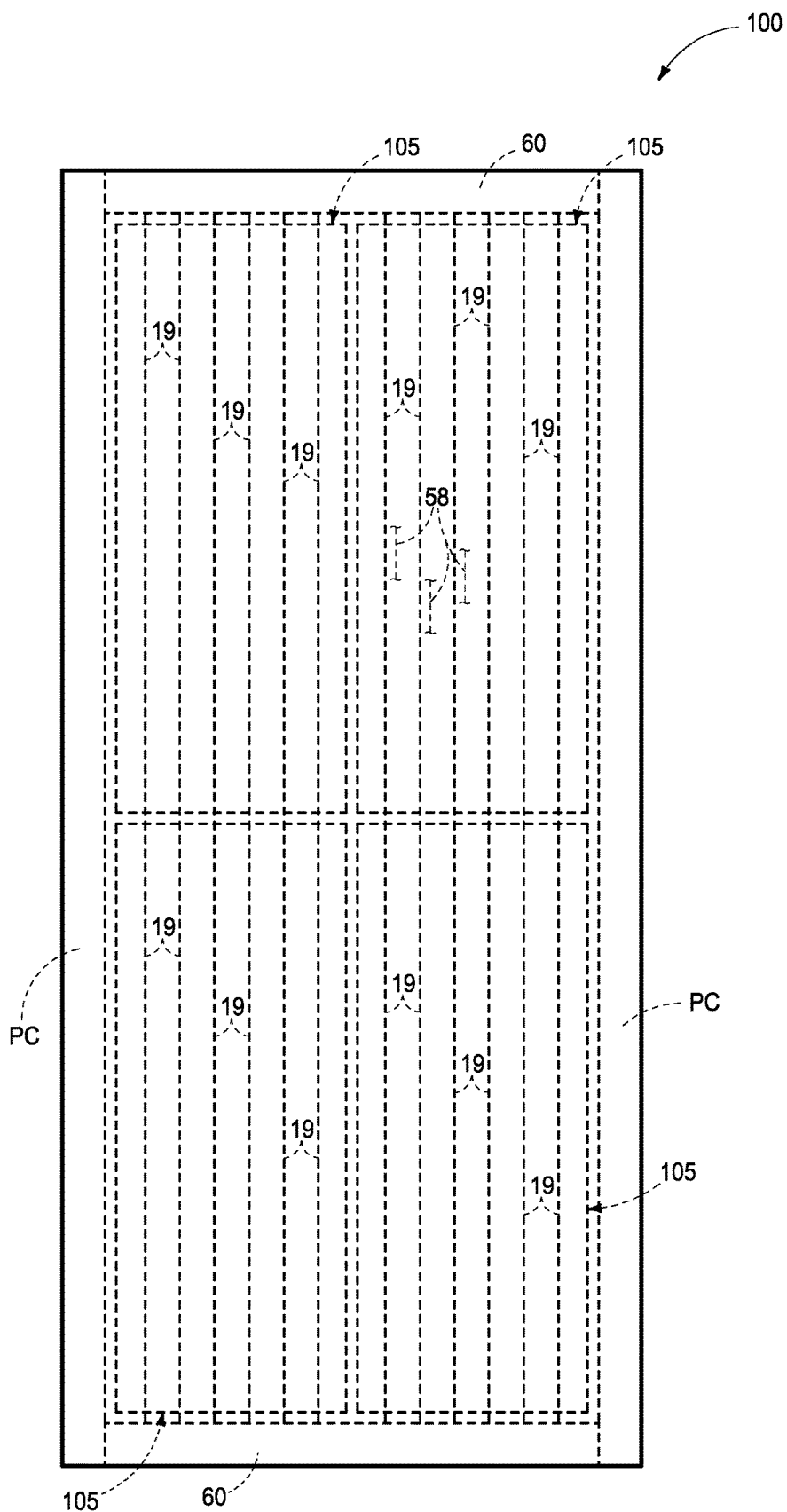
FIG. 1 is a diagrammatic top plan view of a die or die area that may be part of a larger substrate (e.g., a semiconductor wafer, and not shown).
Figure 4:
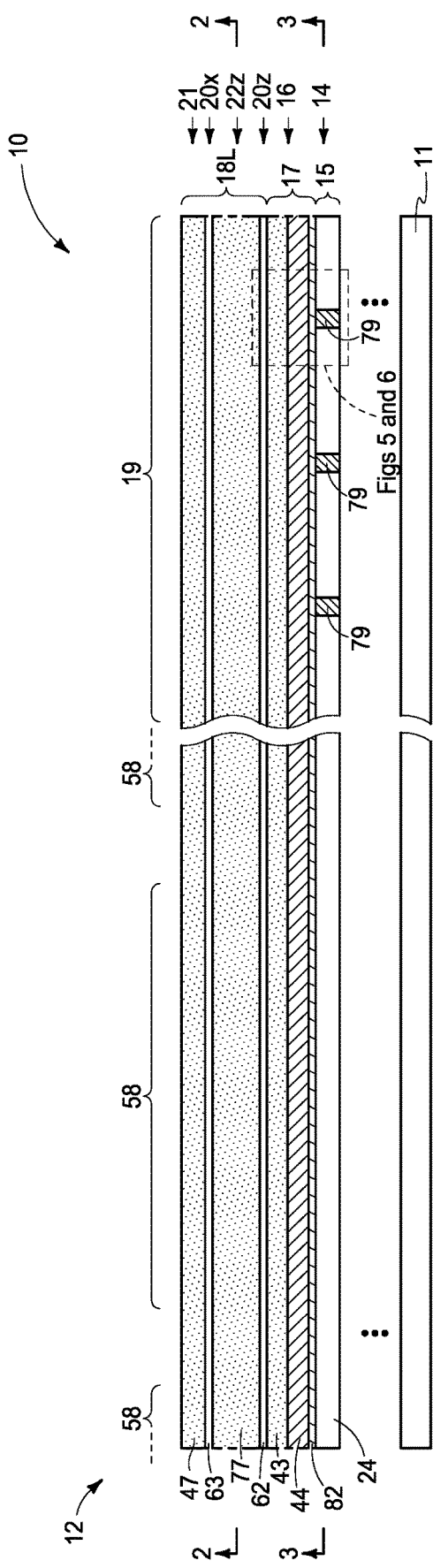

FIG. 1 shows an example diagrammatic embodiment comprising a die or die area 100 that may be part of a larger substrate (e.g., a semiconductor wafer, and not shown) and within which a memory array will be fabricated. Example die area 100 comprises at least one memory-plane region 105 (four being shown), memory-block regions 58 in individual memory-plane regions 105, a stair-step region 60 (two being shown at longitudinal ends of the memory planes), and a peripheral circuitry region PC (two being shown). In this document, "block" is generic to include "sub-block". Alternate orientations may be used, for example having a stair-step region between immediately-adjacent memory planes (not shown). Regions 105, 58, 60, 19, and/or PC may not be discernable at this point of processing. FIGS. 2-4 are diagrammatic larger and varied scale views of portions of die area 100, for example regions 58 and 19.

Referring to FIGS. 2-4, a construction 10 is shown in a method of forming an array or array region 12 of elevationally-extending strings of transistors and/or memory cells (not yet fabricated) and in forming a through-array-via (TAV) region 19. A "TAV region" is a region in which operative TAVs are present or will be formed. An "operative TAV" is a circuit-operative conductive interconnect extending through a stack 18* (described below) and between electronic components at different elevations in a finished construction of integrated circuitry that has been or is being fabricated. A TAV region may also contain one or more dummy TAVs (i.e., a circuit-inoperative structure extending through a stack 18* in a finished construction of integrated circuitry that has been or is being fabricated). Example TAV region 19 may be in individual memory planes 105 (i.e., in-plane; e.g., FIG. 1) or be out-of-plane (i.e., outside of a memory-plane region; e.g., edge-of-plane or in a stair-step region 60). By way of example only, example in-plane TAV regions 19 are so-designated in FIG. 1. The discussion proceeds with respect to a single TAV region 19, although likely multiple TAV regions to which the invention is applicable will exist and whether those multiple TAV regions are in-plane, out-of-plane, and/or a combination of in-plane and out-of-plane.

Example construction 10 comprises a base substrate 11 comprising conductive/conductor/conducting, semiconductive/semiconductor/semiconducting, and/or insulative/insulator/insulating (i.e., electrically herein) materials. Various materials have been formed elevationally over base substrate 11. Materials may be aside, elevationally inward, or elevationally outward of the FIGS. 2-4-depicted materials. For example, other partially or wholly fabricated components of integrated circuitry may be provided somewhere above, about, or within base substrate 11. Control and/or other peripheral circuitry for operating components in an array (e.g., array 12 or memory-array region 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

An insulator tier 14 has been formed above substrate 11 and comprises insulator material 15 (e.g., 24; e.g., silicon nitride and/or silicon dioxide). Insulator tier 14 comprises conducting material 79 (e.g., metal material) that will comprise lower parts of TAVs in TAV region 19 that are being fabricated as will be apparent from the continuing discussion. Conducting material 79 extends through insulator tier 14, for example to circuitry there-below (not shown) that is not material to the inventions disclosed herein.

A conductor tier 16 comprising conductor material 17 has been formed directly above insulator tier 14. Conductor tier 16 comprises lower conductor material 82 (described below) directly above and directly against conducting material 79. Conductor tier 16 comprises an upper conductor material 81 directly above and directly against lower conductor material 82. The lower parts of the TAVs being fabricated in accordance with a method embodiment of the invention will comprise upper conductor material 81, lower conductor material 82, and conducting material 79. In one embodiment, upper conductor material 81 comprises conductively-doped semiconductive material 43 (e.g., n-type-doped or p-type-doped polysilicon). In one embodiment, upper conductor material 81 comprises metal material 44 (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed within array 12.

In one embodiment, a lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20*. Lower portion 18L, conductor tier 16, and insulator tier 14 collectively comprise laterally-spaced memory-block regions 58 that will comprise laterally-spaced memory blocks 58 in a finished circuitry construction and comprise TAV region 19. Memory-block regions 58 and resultant memory blocks 58 (not yet shown) may be considered as being longitudinally elongated and oriented, for example horizontally-parallel relative one another, along a direction 55. Memory-block regions 58 may not be discernable at this point of processing. A TAV region may be within a memory-block region (not shown).

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20z of second tiers 20* directly above (e.g., directly against) conductor material 17. Example lowest second tier 20z is insulative and may be sacrificial (e.g., comprising material 62, for example silicon dioxide and/or silicon nitride). A next-lowest second tier 20x of second tiers 20* is directly above lowest second tier 20z (e.g., comprising material 63, for example silicon dioxide and/or silicon nitride). A lowest tier 22z of first tiers 22* comprising sacrificial material 77 (e.g., polysilicon or silicon nitride) is vertically between lowest second tier 20z and next-lowest second tier 20x. In one embodiment, lower portion 18L comprises a conducting-material tier 21 comprising conducting material 47 (e.g., conductively-doped polysilicon) that is directly above next-lowest second tier 20x. Additional tiers may be present. For example, one or more additional tiers may be above tier 21 (tier 21 thereby not being the uppermost tier in portion 18L, and not shown), and/or below tier 22z (other than 20z not being shown).

Lower conductor material 82 comprises at least one of (a) and (b), where:
(a): a metal-rich refractory metal nitride; and
(b): a stoichiometric or non-stoichiometric refractory metal nitride directly above and directly against one of (1), (2), or (3), where:
(1): an elemental metal;
(2): an alloy of at least two elemental metals; and
(3): a metal-rich refractory metal nitride of different composition from that of the stoichiometric or non-stoichiometric refractory metal nitride.

Figure 6:
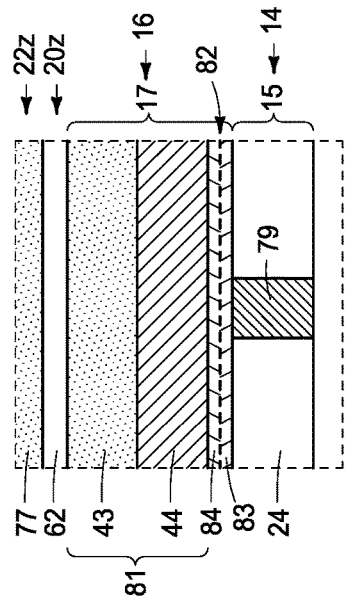
Figure 5:
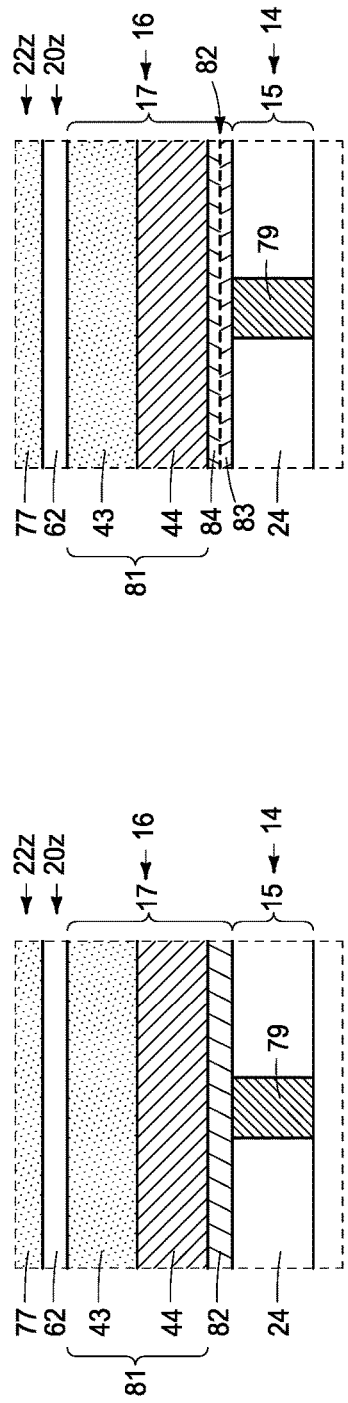

FIGS. 5 and 6 depict detailed portions of TAV region 19 according to example embodiments. With reference to FIG.

5, upper conductor material 81 can comprise metal material 44 (e.g., a metal silicide such as $WSi_x$). Lower conductor material 82 can comprise a refractory metal nitride that can be stoichiometric or non-stoichiometric. As used herein, the term "non-stoichiometric" means and includes a chemical compound with an elemental composition that cannot be represented by a ratio of well-defined natural numbers and is in violation of the law of definite proportions. For example, lower conductor material 82 as a metal-rich refractory metal nitride that is non-stoichiometric can be $M_xN_y$, (M, metal), where "x" and "y" are not equal. Accordingly, for a metal-rich refractory metal nitride, "x" is greater than "y" (more of the metal than in the stoichiometric metal nitride). In accordance with example implementations, a metal-rich refractory metal nitride may have a y as low as 0.25 (e.g., $MN_{0.25}$). Alternatively, for a metal-poor refractory metal nitride, "x" is less than "y" (less of the metal than in the stoichiometric metal nitride). Example refractory metals are Ti, Zr, Hf, V, Nb, Ta, Cr, Mo, W, Mn, Re, Ru, Os, Rh, and Ir. Lower conductor material 82 can comprise a metal-rich refractory metal nitride (ideal) and/or a metal-poor refractory metal nitride (not ideal). Composite materials such as metal nitrides can contain, throughout one or more regions thereof, an average ratio of "x" atoms of one element (M, metal), "y" atoms of another element (N, nitride). As the formulae are representative of relative atomic ratios and not strict chemical structure, lower conductor material 82 may comprise one or more stoichiometric compounds and/or one or more non-stoichiometric compounds, and values of "x" and "y," may be integers or may be non-integers.

In accordance with some implementations, lower conductor material 82 can comprise metal-rich refractory metal nitride of constant refractory metal content that is directly against upper conductor material 81 and conducting material 79. The metal-rich refractory metal nitride of constant refractory metal content comprises one or more of Ti, Zr, Hf, V, Nb, Ta, Cr, Mo, W, Mn, Re, Ru, Os, Rh, and Ir. In at least one example, the metal nitride comprises Ti.

Referring to FIG. 6, and as examples only, lower conductor material 82 can comprise an upper portion 84 directly above and directly against a lower portion 83. Upper portion 84 can be directly below and directly against a metal silicide (e.g., $WSi_x$) of upper conductor material 81. Upper portion 84 can be a stoichiometric or non-stoichiometric refractory metal nitride. Lower portion 83 can be an elemental metal, an alloy of at least two metals, and/or a metal-rich refractory metal nitride of different composition from that of the stoichiometric or non-stoichiometric refractory metal nitride of upper portion 84. Accordingly, in terms of metal to nitride, upper portion 84 can have a lower metal content than lower portion 83. While these materials may be homogenous, upper portion 84 can contain less metal to nitride than lower portion 83. In this configuration, the lower conductor material 82 can be considered graded, having a lower metal to nitride ratio material contacting upper conductor material 81 than a higher metal to nitride ratio material contacting conducting material 79.

According to one example, upper portion 84 and lower portion 83 can individually comprise a refractory metal nitride. The refractory metal nitride of lower portion 83 can be metal-rich and directly against conducting material 79, and comprising more of the refractory metal than upper portion 84.

According to another example, upper portion 84 comprises a refractory metal nitride directly above and directly against lower portion 83, and lower portion 83 comprises an elemental metal or an alloy of at least two elemental metals, the elemental metal or the alloy being directly against conducting material 79. For example, lower conductor material 82 comprises the elemental metal which is directly against conducting material 79 and the refractory metal nitride. As another example, lower conductor material 82 can comprise the alloy of at least two elemental metals which is directly against conducting material 79 and the refractory metal nitride. The elemental metal or alloy of lower portion 83 can comprise one or more of Ti, Zr, Hf, V, Nb, Ta, Cr, Mo, W, Mn, Re, Ru, Os, Rh, and Ir. In at least one example, the elemental metal or the alloy comprises Ti.

In a particular embodiment, upper conductor material 81 comprises a metal silicide above and directly against upper portion 84 comprising TiN below the metal silicide, with lower portion 83 comprising elemental Ti or an alloy comprising Ti below the TiN of upper portion 84.

Figure 7:
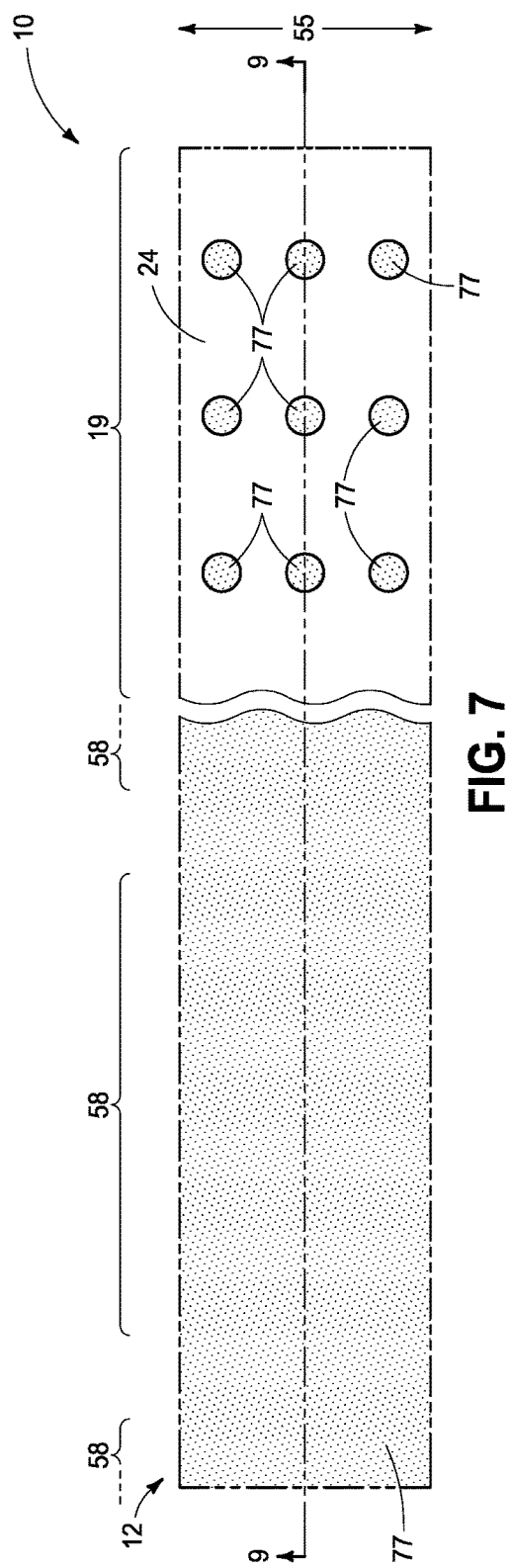
Figure 8:
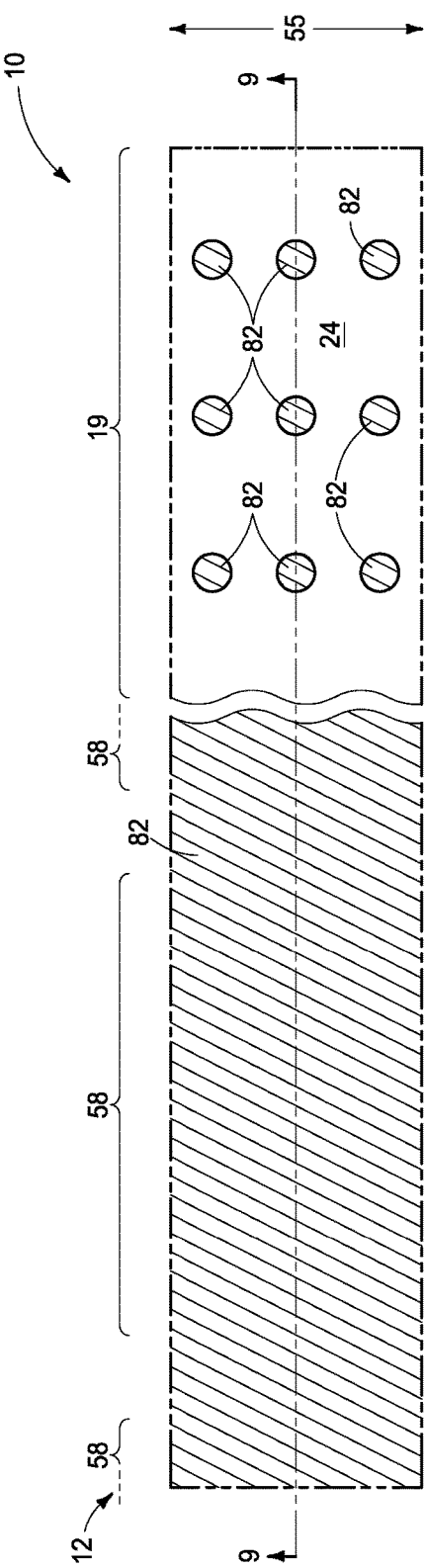
Figure 14:
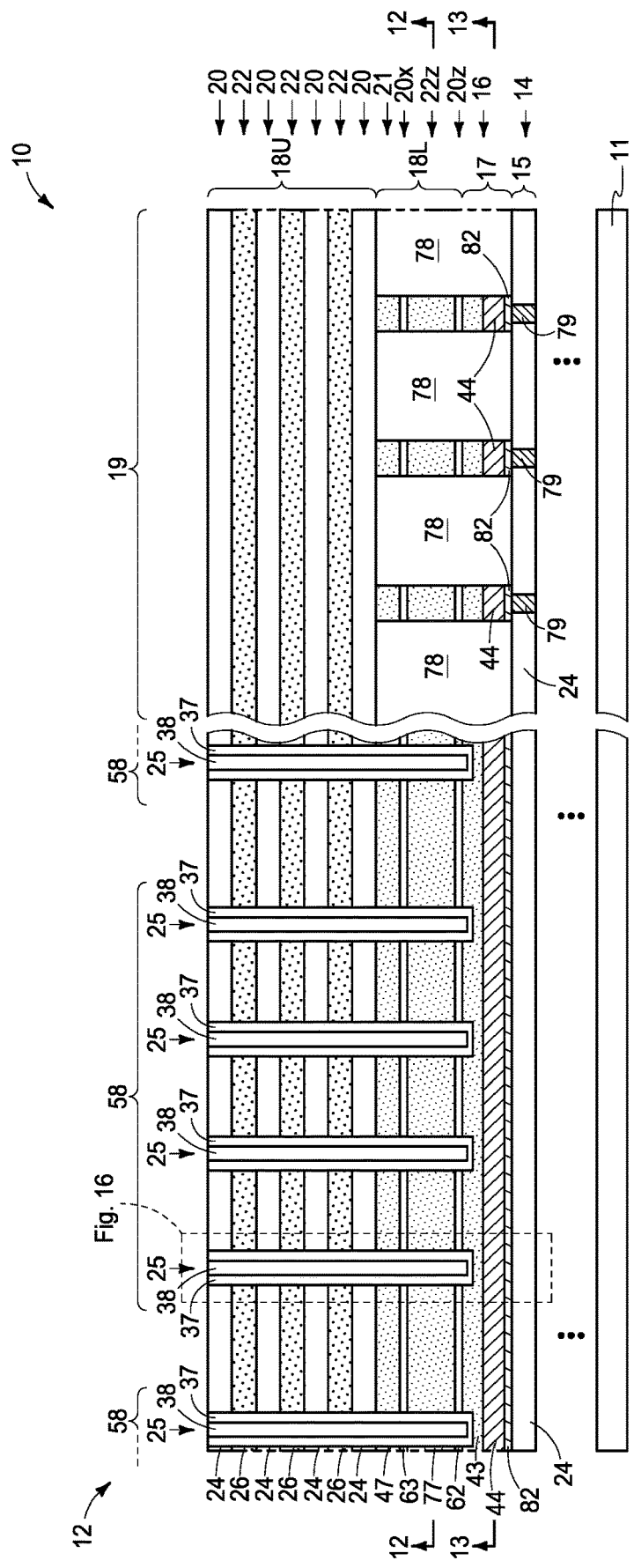
Figure 15:
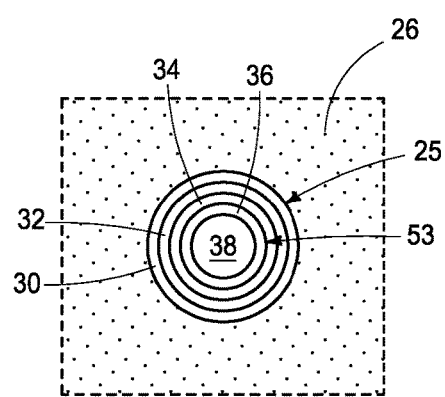
Figure 16:
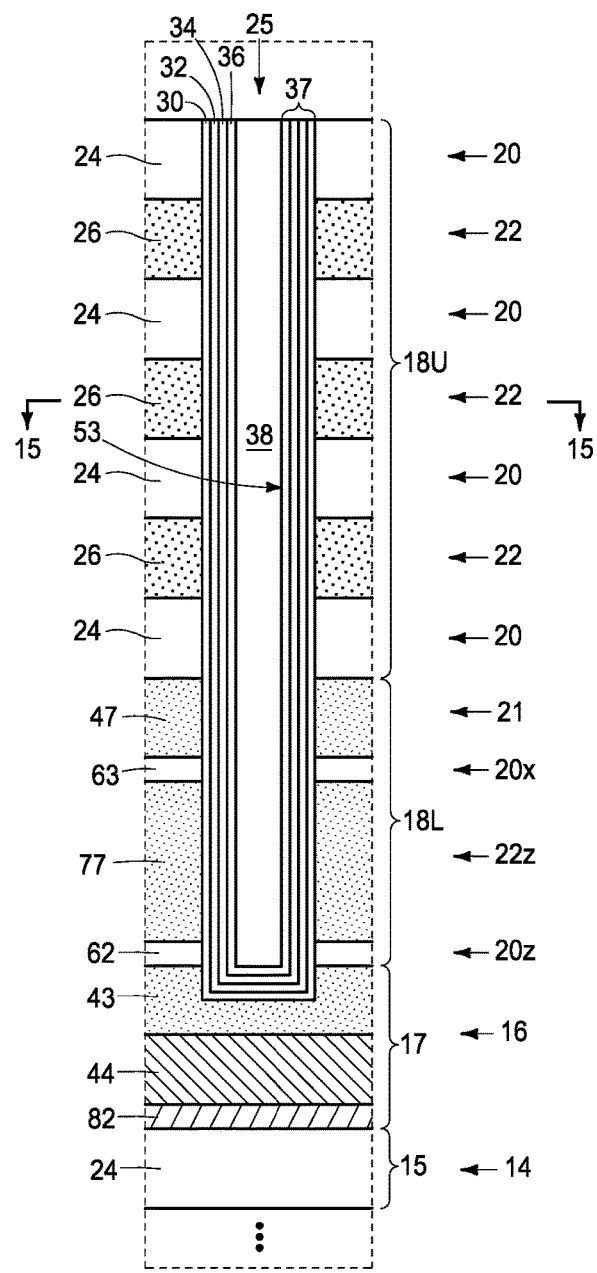

Referring to FIGS. 7-9, and in one embodiment, islands 85 comprising materials 47, 63, 77, 62, 81 (43, 44), and 82 have been formed above tier 14 in TAV region 19 (e.g., by photolithographic patterning and etch). Void space left thereby has been filled with insulator material 78 (e.g., silicon dioxide and/or silicon nitride, by overfilling such void space and planarizing such back at least to a top surface of remaining material 47). FIGS. 10 and 11 depict portions of islands 85 according to example implementations. FIG. 10 depicts a configuration with lower conductor material 82 of FIG. 5, and FIG. 11 depicts a configuration comprising upper portion 84 and lower portion 83 of FIG. 6.

Referring to FIGS. 12-16, an upper portion 18U of stack 18\* has been formed above lower portion 18L. Upper portion 18U comprises vertically-alternating different composition first tiers 22 and second tiers 20. First tiers 22 may be conductive and second tiers 20 may be insulative, yet need not be so at this point of processing in conjunction with the hereby initially-described example method embodiment which is "gate-last" or "replacement-gate". Example first tiers 22 and second tiers 20 comprise different composition materials 26 and 24 (e.g., silicon nitride and silicon dioxide), respectively. Example upper portion 18U is shown starting above lower portion 18L with a second tier 20 although such could alternately start with a first tier 22 (not shown). Further, and by way of example, lower portion 18L may be formed to have one or more first and/or second tiers as a top thereof. Regardless, only a small number of tiers 20 and 22 is shown, with more likely upper portion 18U (and thereby stack 18\*) comprising dozens, a hundred or more, etc. of tiers 20 and 22. Further, other circuitry that may or may not be part of peripheral and/or control circuitry may be between conductor tier 16 and stack 18\*. By way of example only, multiple vertically-alternating tiers of conductive material and insulative material of such circuitry may be below a lowest of conductive tiers 22 and/or above an uppermost of conductive tiers 22. For example, one or more select gate tiers (not shown) may be between conductor tier 16 and lowest conductive tier 22 and one or more select gate tiers may be above an uppermost of conductive tiers 22. Alternately or additionally, at least one of the depicted uppermost and lowest conductive tiers 22 may be a select gate tier.

Channel openings 25 have been formed (e.g., by etching) through second tiers 20 and first tiers 22 in region 58 in upper portion 18U to conductor tier 16 in lower portion 18L (e.g., at least to lowest first tier 22z) in lower portion 18L. Channel openings 25 may taper radially-inward (not shown) moving deeper in stack 18. In some embodiments, channel openings 25 may go into conductor material 17 of conductor tier 16 as shown or may stop there-atop (not shown).

Alternately, as an example, channel openings 25 may stop atop or within the lowest second tier 20z. A reason for extending channel openings 25 at least to conductor material 17 of conductor tier 16 is to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductor material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

In one embodiment, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 can be prior to forming upper portion 18U. Channel openings 25 may then be formed by etching materials 24 and 26 to stop on or within the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

Figure 17:
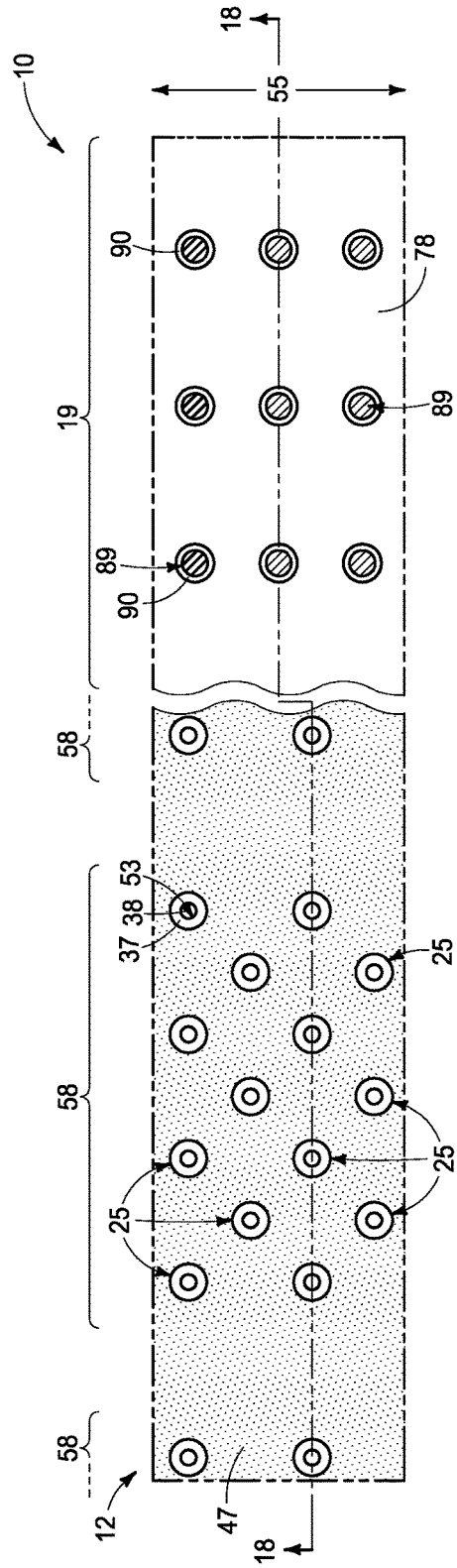
Figure 18:
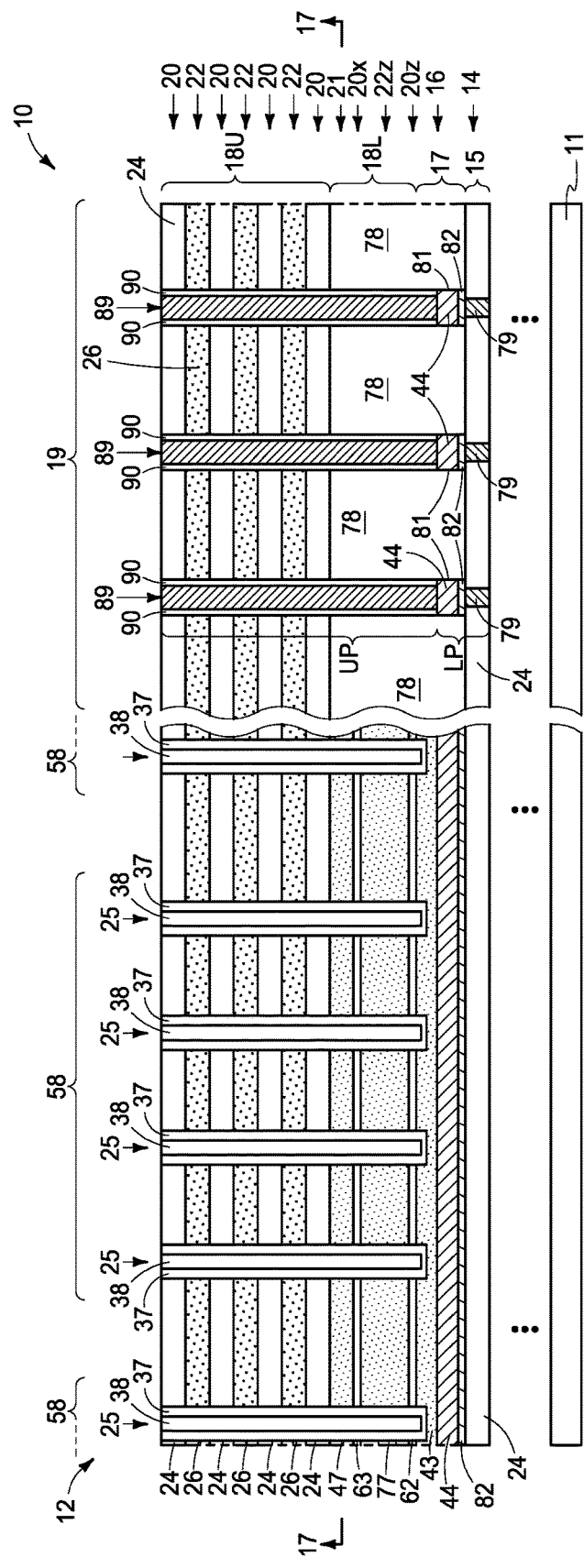
Figure 21:
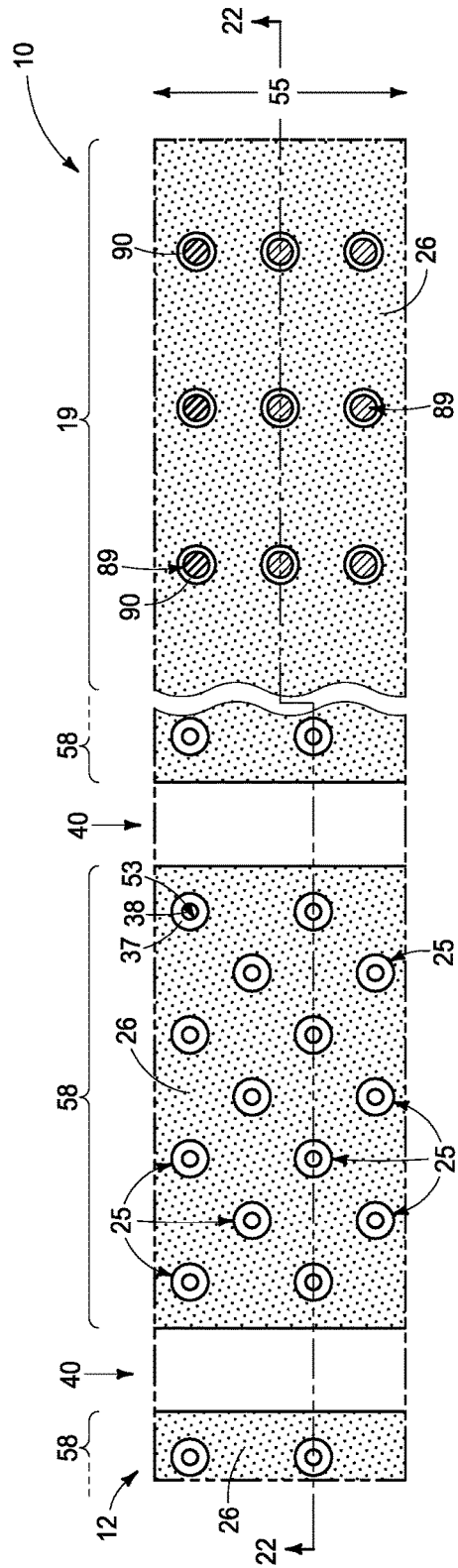
Figure 22:
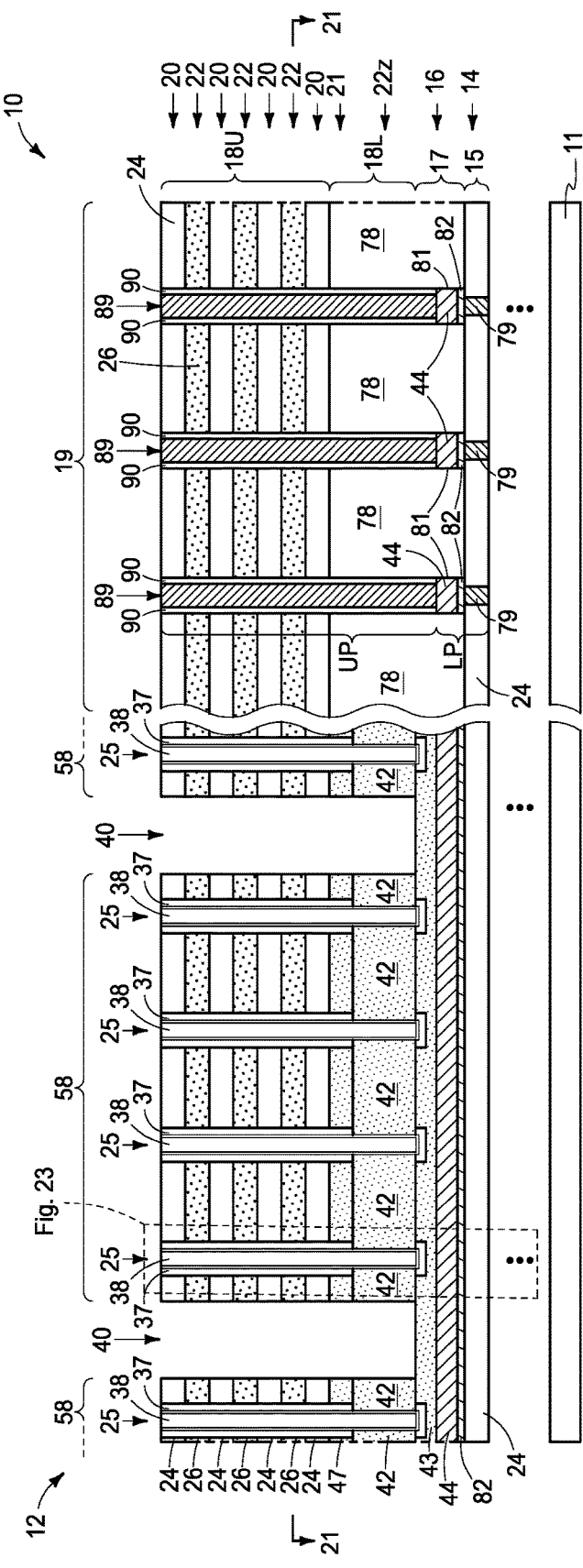
Figure 23:
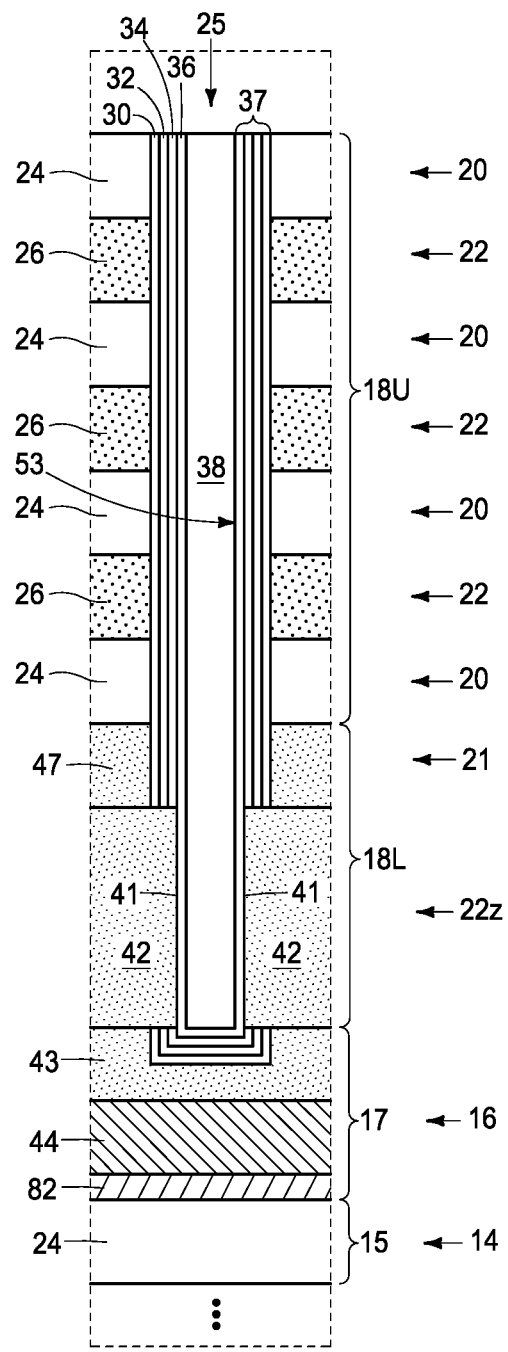
Figure 24:
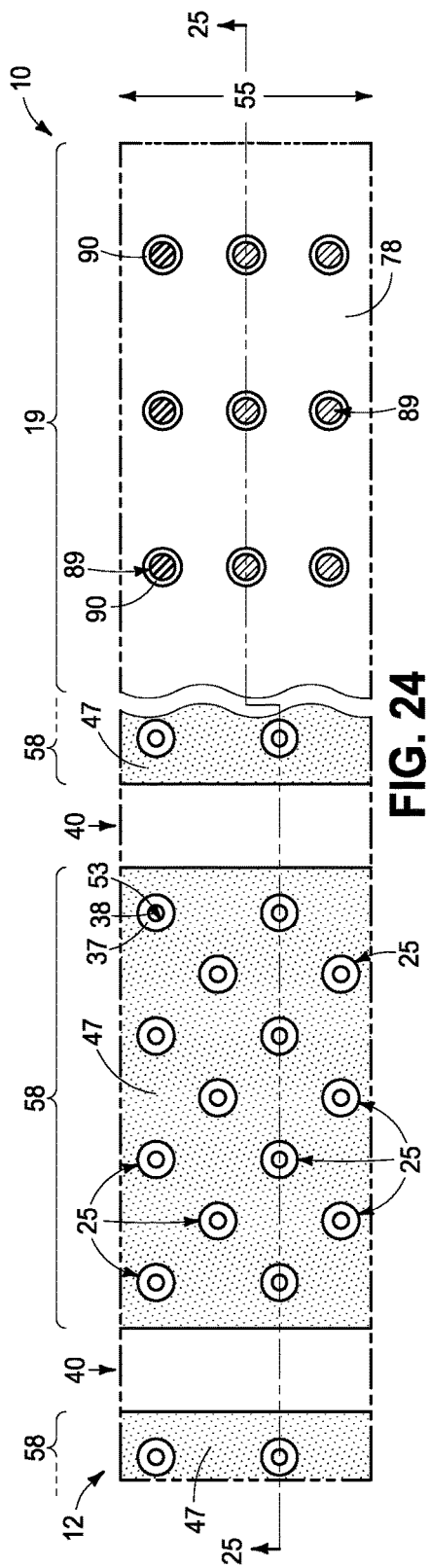
Figure 25:
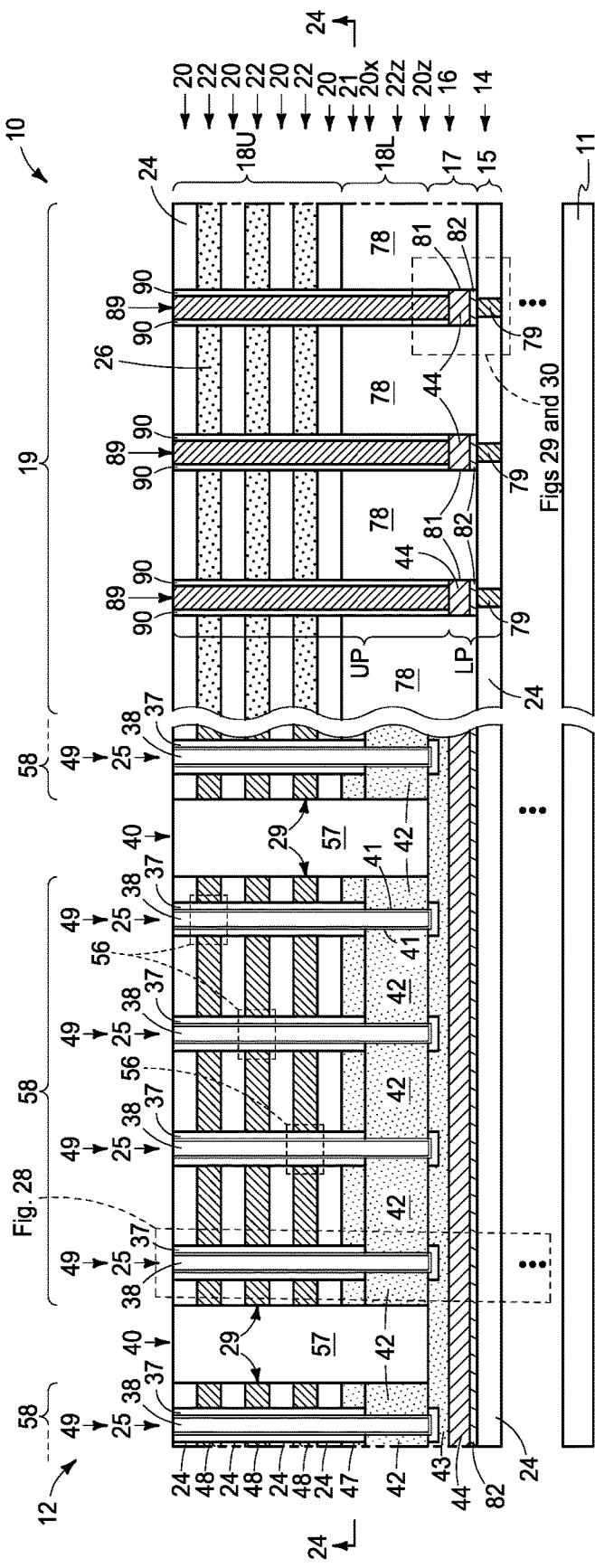
Figure 26:
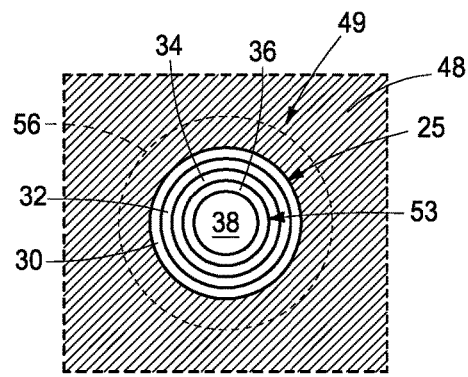
Figure 27:
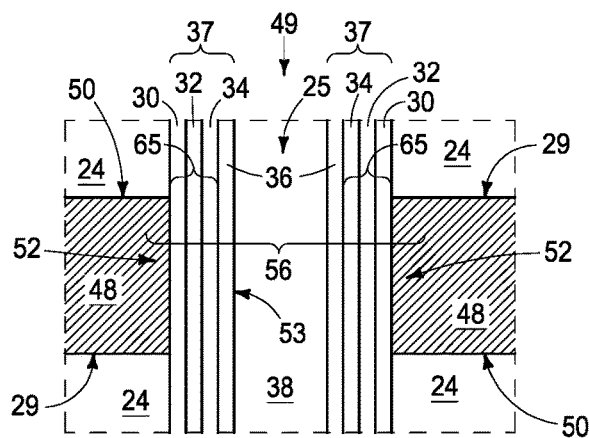
Figure 28:
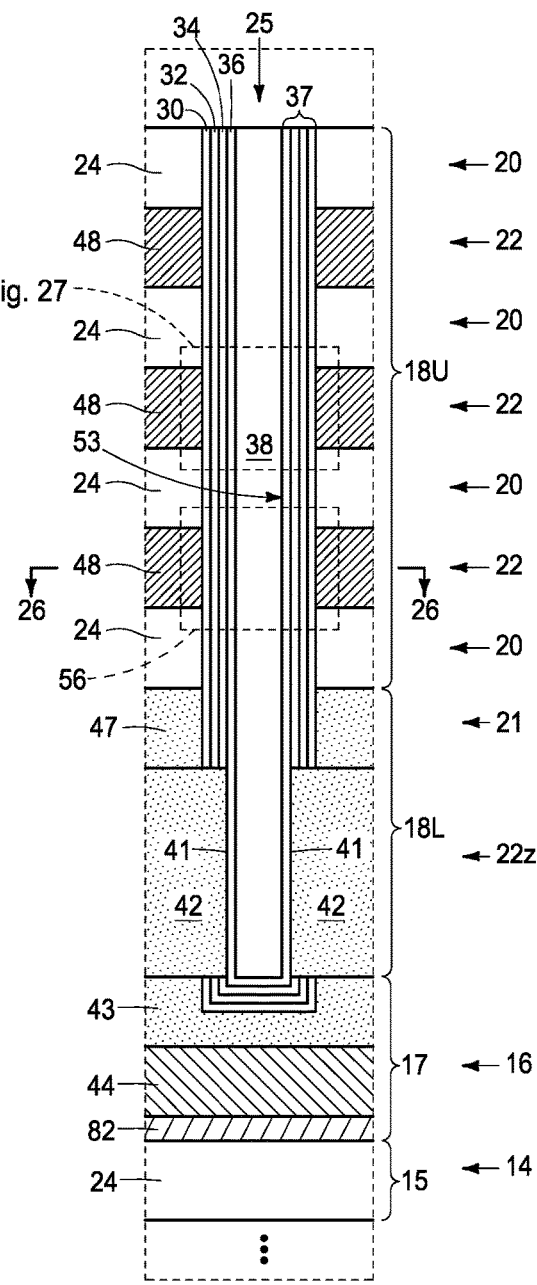
Figure 30:
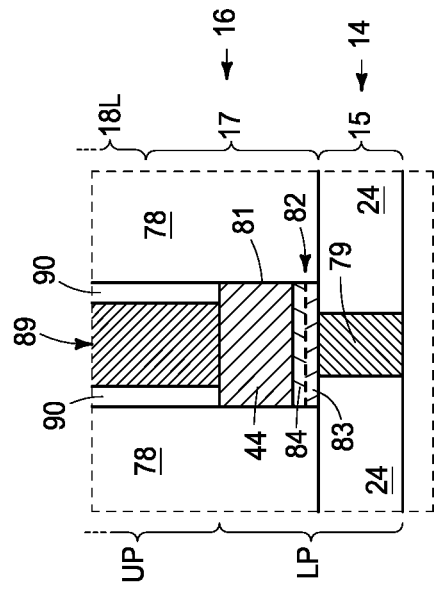
Figure 29:
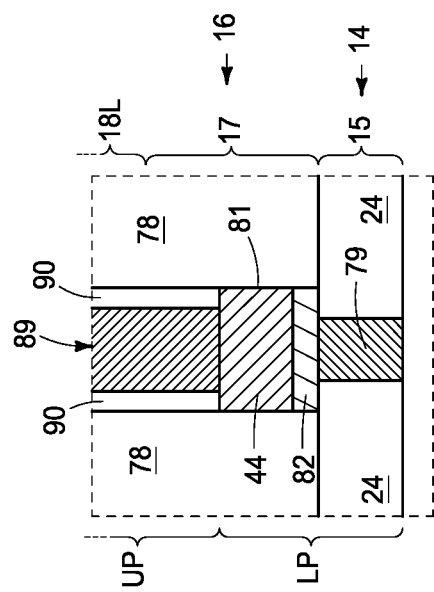

FIGS. 17 and 18 depict formation of TAVs 89 (e.g., a TiN lining having a W core and that are not shown). Specifically, and by way of example, upper parts UP of TAVs 89 have been formed through vertical stack 18* in TAV region 19 and that individually directly electrical couple to individual lower parts LP of TAVs 89. Upper parts UP are shown as extending to material 44 of upper conductor material 81. Alternately, upper parts UP may stop atop or within material 43 of upper conductor material 81, with lower parts LP starting there-below (not shown). An example insulator lining 90 is shown circumferentially about and vertically along upper parts UP (e.g., silicon dioxide and/or silicon nitride).

Referring to FIGS. 19 and 20, horizontally-elongated trenches 40 have been formed (e.g., by anisotropic etching) into stack 18* through upper portion 18U and that extend through next-lowest second tier 20x to sacrificial material 77 of lowest first tier 22z. Trenches 40 are individually between immediately-laterally-adjacent memory-block regions 58. Trenches 40 may taper laterally-inward in vertical cross-section moving deeper into stack 18. By way of example and for brevity only, channel openings 25 are shown as being arranged in groups or columns of staggered rows of three and four channel openings 25 per row. Trenches 40 will typically be wider than channel openings 25 (e.g., 3 to 10 times wider, yet such wider degree not being shown for brevity). Any alternate existing or future-developed arrangement and construction may be used. Trenches 40 and channel openings 25 may be formed in any order relative the other or at the same time.

Trenches 40 as shown have been formed to extend to material 77 of lowest first tier 22z. As one example, trenches 40 may initially be formed by etching materials 24, 26, and 47 (likely using different anisotropic etching chemistries) and that stop on or within material 63 of next-lowest second tier 20x. A thin sacrificial liner 94 (e.g., hafnium oxide, aluminum oxide, multiple layers of silicon dioxide and silicon nitride, etc.) may then be formed, followed by punch-etching there-through to expose material 63, and followed by punch-etching through material 63 to expose material 77. Alternately, and by way of example only, a sacrificial etch-stop line (not shown) having the same general horizontal outline as trenches 40 may individually be formed in conducting-material tier 21 (when present) directly above and in contact with material 63 of next-lowest second tier 20x before forming upper portion 18U. Trenches 40 may then be formed by etching materials 24 and 26 to stop on or within the material of the individual sacrificial lines, followed by exhuming remaining material of such sacrificial lines prior to forming thin sacrificial liner 94. One or more trenches 40 may be formed directly against TAV region 19 (not shown) including, for example, at least partially there-within (not shown). Alternately, a trench 40 that is closest to TAV region 19 may be laterally spaced therefrom.

In one embodiment, sacrificial material 77 is replaced with conductive material that directly electrically couples together channel material 36 of channel-material strings 53 and conductor material 17 (upper and lower conductor materials 81, 82) of conductor tier 16. For example, and referring to FIGS. 21-23, several example processing steps have occurred since those shown by FIGS. 19 and 20. Sacrificial material 77 (not shown) has been removed from lowest first tier 22z through trenches 40 to leave or form a void space vertically between lowest second tier 20z and next-lowest second tier 20x. Such may occur, for example, by isotropic etching that is ideally conducted selectively relative to materials 62 and 63, for example using liquid or vapor $H_3PO_4$ as a primary etchant where material 77 is silicon nitride or using tetramethyl ammonium hydroxide [TMAH] where material 77 is polysilicon. The artisan is capable of selecting other chemistries for materials 77.

Subsequently, in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 94 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment and as shown, such etching has been conducted selectively relative to liner 94 (when present). In one embodiment, materials 62 and 63 (not shown) are also removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired.

After exposing sidewall 41, conducting material 42 (e.g., conductively-doped polysilicon) has been formed in lowest first tier 22z and in one embodiment directly against sidewall 41 of channel material 36. In one embodiment and as shown, such has been formed directly against a bottom of conducting material 47 of conducting-material tier 21 and directly against a top of overlying conductor material 43 of conductor tier 16, thereby directly electrically coupling together channel material 36 of individual channel-material strings 53 with overlying conductor material 43 of conductor tier 16 and conducting material 47 of conducting-material tier 21. Subsequently, and by way of example, conducting material 42 has been removed from trenches 40 as has sacrificial liner 94 (not shown). Sacrificial liner 94 may be removed before or after forming conducting material 42.

Referring to FIGS. 24-28, material 26 of conductive tiers 22 in array region 12 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 in conductive tiers 22 in array region 12 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

Some, all, or none of material 26 may be removed from TAV region 19 (no removal therefrom being shown), for example depending on proximity of trenches 40 that are closest thereto and/or presence or lack thereof of etch-blocking material(s)/structure(s) in tiers 22 in upper portion 18U (not shown).

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. Intervening material 57 may include through array vias (not shown).

Any other attribute(s) or aspect(s) as shown and/or described herein with respect to other embodiments may be used in the embodiments shown and described with reference to the above embodiments.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises a vertical stack (e.g., 18*) comprising alternating insulative tiers (e.g., 20*) and conductive tiers (e.g., 22*) above a conductor tier (e.g., 16). Strings (e.g., 49) of memory cells (e.g., 56) comprising channel-material strings (e.g., 53) extend through the insulative tiers and the conductive tiers. The conductor tier comprises upper conductor material (e.g., 81) directly above and directly against lower conductor material (e.g., 82) of different composition from that of the upper conductor material. The channel-material strings directly electrically couple to the upper and lower conductor materials of the conductor tier. A through-array-via (TAV) region (e.g., 19) is included and that comprises TAVs (e.g., 89). The TAVs individually comprise the upper conductor material, the lower conductor material, and a conducting material (e.g., 79) that is directly below the conductor tier. The lower conductor material is directly against the upper conductor material and directly against the conducting material. The lower conductor material comprises at least one of (a) and (b), where, (a): a metal-rich refractory metal nitride; and (b): a stoichiometric or non-stoichiometric refractory metal nitride directly above and directly against one of (1), (2), or (3), where: (1): an elemental metal; (2): an alloy of at least two elemental metals; and (3): a metal-rich refractory metal nitride of different composition from that of the stoichiometric or non-stoichiometric refractory metal nitride. Any other attribute(s) or aspect(s) as shown and/or described herein with respect to other embodiments may be used.

In one embodiment, a memory array (e.g., 12) comprising strings (e.g., 49) of memory cells (e.g., 56) comprises a vertical stack (e.g., 18*) comprising alternating insulative tiers (e.g., 20*) and conductive tiers (e.g., 22*) above a conductor tier (e.g., 16). Strings (e.g., 49) of memory cells (e.g., 56) comprising channel-material strings (e.g., 53) extend through the insulative tiers and the conductive tiers. The conductor tier comprises upper conductor material (e.g., 81) directly above and directly against lower conductor material (e.g., 82) of different composition from that of the upper conductor material. The channel-material strings directly electrically couple to the upper and lower conductor materials of the conductor tier. A through-array-via (TAV) region (e.g., 19) is included and that comprises TAVs (e.g., 89). The TAVs individually comprise the upper conductor material, the lower conductor material, and a conducting material (e.g., 79) that is directly below the conductor tier. The lower conductor material comprises an upper portion (e.g., 84) and a lower portion (e.g., 83) that are directly against one another and individually comprise a refractory metal nitride. The refractory metal nitride of the lower portion is metal-rich, directly against the conducting material, and comprises more of the refractory metal than the upper portion. Any other attribute(s) or aspect(s) as shown and/or described herein with respect to other embodiments may be used.

In one embodiment, a memory array (e.g., 12) comprising strings (e.g., 49) of memory cells (e.g., 56) comprises a vertical stack (e.g., 18*) comprising alternating insulative tiers (e.g., 20*) and conductive tiers (e.g., 22*) above a conductor tier (e.g., 16). Strings (e.g., 49) of memory cells (e.g., 56) comprising channel-material strings (e.g., 53) extend through the insulative tiers and the conductive tiers. The conductor tier comprises upper conductor material (e.g., 81) directly above and directly against lower conductor material (e.g., 82) of different composition from that of the upper conductor material. The channel-material strings directly electrically couple to the upper and lower conductor materials of the conductor tier. A through-array-via (TAV) region (e.g., 19) is included and that comprises TAVs (e.g., 89). The TAVs individually comprise the upper conductor material, the lower conductor material, and a conducting material (e.g., 79) that is directly below the conductor tier. The lower conductor material is directly against the upper conductor material and directly against the conducting material. The lower conductor material comprises a refractory metal nitride directly above and directly against an elemental metal or an alloy of at least two elemental metals. The elemental metal or the alloy is directly against the conducting material. Any other attribute(s) or aspect(s) as shown and/or described herein with respect to other embodiments may be used.

In one embodiment, a memory array (e.g., 12) comprising strings (e.g., 49) of memory cells (e.g., 56) comprises a vertical stack (e.g., 18*) comprising alternating insulative tiers (e.g., 20*) and conductive tiers (e.g., 22*) above a conductor tier (e.g., 16). Strings (e.g., 49) of memory cells (e.g., 56) comprising channel-material strings (e.g., 53) extend through the insulative tiers and the conductive tiers. The conductor tier comprises upper conductor material (e.g., 81) directly above and directly against lower conductor material (e.g., 82) of different composition from that of the upper conductor material. The channel-material strings directly electrically couple to the upper and lower conductor materials of the conductor tier. A through-array-via (TAV) region (e.g., 19) is included and that comprises TAVs (e.g., 89). The TAVs individually comprise the upper conductor material, the lower conductor material, and a conducting material (e.g., 79) that is directly below the conductor tier. The lower conductor material is directly against the upper conductor material and directly against the conducting material. The lower conductor material comprises metal-rich refractory metal nitride of constant refractory metal content that is directly against the upper conductor material and the conducting material. Any other attribute(s) or aspect(s) as shown and/or described herein with respect to other embodiments may be used.

Although not in any way so limited, at least some implementations of the invention may reduce undesired and/or uncontrolled formation of a silicide by reaction of conducting material 79 and the bottom of lower conductor material 82.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a memory array comprising strings of memory cells comprises a vertical stack comprising alternating insulative tiers and conductive tiers above a conductor tier. Strings of memory cells comprising channel-material strings extend through the insulative tiers and the conductive tiers. The conductor tier comprises upper conductor material directly above and directly against lower conductor material of different composition from that of the upper conductor material. The channel-material strings directly electrically couple to the upper and lower conductor materials of the conductor tier. A through-array-via (TAV) region is included and comprises TAVs. The TAVs individually comprise the upper conductor material, the lower conductor material, and a conducting material that is directly below the conductor tier. The lower conductor material is directly against the upper conductor material and directly against the conducting material. The lower conductor material comprises at least one of (a) and (b), where, (a): a metal-rich refractory metal nitride; and (b): a stoichiometric or non-stoichiometric refractory metal nitride directly above and directly against one of (1), (2), or (3), where: (1): an elemental metal; (2): an alloy of at least two elemental metals; and (3): a metal-rich refractory metal nitride of different composition from that of the stoichiometric or non-stoichiometric refractory metal nitride.

In some embodiments, a memory array comprising strings of memory cells comprises a vertical stack comprising alternating insulative tiers and conductive tiers above a conductor tier. Strings of memory cells comprising channel-material strings extend through the insulative tiers and the conductive tiers. The conductor tier comprises upper conductor material directly above and directly against lower conductor material of different composition from that of the upper conductor material. The channel-material strings directly electrically couple to the upper and lower conductor materials of the conductor tier. A through-array-via (TAV) region is included and comprises TAVs. The TAVs individually comprise the upper conductor material, the lower conductor material, and a conducting material that is directly below the conductor tier. The lower conductor material comprises an upper portion and a lower portion that are directly against one another and individually comprise a refractory metal nitride. The refractory metal nitride of the lower portion is metal-rich, directly against the conducting material, and comprises more of the refractory metal than the upper portion.

In some embodiments, a memory array comprising strings of memory cells comprises a vertical stack comprising alternating insulative tiers and conductive tiers above a conductor tier. Strings of memory cells comprising channel-material strings extend through the insulative tiers and the conductive tiers. The conductor tier comprises upper conductor material directly above and directly against lower conductor material of different composition from that of the upper conductor material. The channel-material strings directly electrically couple to the upper and lower conductor materials of the conductor tier. A through-array-via (TAV) region is included and comprises TAVs. The TAVs individually comprise the upper conductor material, the lower conductor material, and a conducting material that is directly below the conductor tier. The lower conductor material is directly against the upper conductor material and directly against the conducting material. The lower conductor material comprises a refractory metal nitride directly above and directly against an elemental metal or an alloy of at least two elemental metals. The elemental metal or the alloy is directly against the conducting material.

In some embodiments, a memory array comprising strings of memory cells comprises a vertical stack comprising alternating insulative tiers and conductive tiers above a conductor tier. Strings of memory cells comprising channel-material strings extend through the insulative tiers and the conductive tiers. The conductor tier comprises upper conductor material directly above and directly against lower conductor material of different composition from that of the upper conductor material. The channel-material strings directly electrically couple to the upper and lower conductor materials of the conductor tier. A through-array-via (TAV) region is included and comprises TAVs. The TAVs individually comprise the upper conductor material, the lower conductor material, and a conducting material that is directly below the conductor tier. The lower conductor material is directly against the upper conductor material and directly against the conducting material. The lower conductor material comprises metal-rich refractory metal nitride of constant refractory metal content that is directly against the upper conductor material and the conducting material.

In some embodiments, a method used in forming a memory array comprising strings of memory cells comprises forming conducting material of lower parts of through-array-vias (TAVs) in a TAV region. A conductor tier is formed that is in both a memory array region and the TAV region. The conductor tier comprises lower conductor material directly above and directly against the conducting material of the lower parts of the TAVs. The lower conductor material comprises at least one of (a) and (b), where, (a): a metal-rich refractory metal nitride; and (b): a stoichiometric or non-stoichiometric refractory metal nitride directly above and directly against one of (1), (2), or (3), where: (1): an elemental metal; (2): an alloy of at least two elemental metals; and (3): a metal-rich refractory metal nitride of different composition from that of the stoichiometric or non-stoichiometric refractory metal nitride. The conductor tier comprises an upper conductor material directly above and directly against the lower conductor material. The lower parts of the TAVs individually comprise the upper conductor material, the lower conductor material, and the conducting material. A vertical stack is formed comprising alternating different-composition first tiers and second tiers directly above the conductor tier in the memory array region and the TAV region. Channel material strings are formed through the vertical stack in the memory array region and that directly electrically couple to the upper and lower conductor materials of the conductor tier. Upper parts of the TAVs are formed through the vertical stack in the TAV region and that individually directly electrical couple to individual of the lower parts of the TAVs.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:
   a vertical stack comprising alternating insulative tiers and conductive tiers above a conductor tier, strings of memory cells comprising channel-material strings that extend through the insulative tiers and the conductive tiers, the conductor tier comprising upper conductor material directly above and directly against lower conductor material of different composition from that of the upper conductor material, the channel-material strings directly electrically coupling to the upper and lower conductor materials of the conductor tier; and
   a through-array-via (TAV) region comprising TAVs; the TAVs individually comprising the upper conductor material, the lower conductor material, and a conducting material that is directly below the conductor tier; the lower conductor material being directly against the upper conductor material and directly against the conducting material, the lower conductor material comprising at least one of (a) and (b), where,
   (a): a metal-rich refractory metal nitride; and
   (b): a stoichiometric or non-stoichiometric refractory metal nitride directly above and directly against one of (1), (2), or (3), where:
     (1): an elemental metal;
     (2): an alloy of at least two elemental metals; and
     (3): a metal-rich refractory metal nitride of different composition from that of the stoichiometric or non-stoichiometric refractory metal nitride.

2. The memory array of claim 1 comprising the (a).
3. The memory array of claim 1 comprising the (b).
4. The memory array of claim 3 comprising the stoichiometric refractory metal nitride.
5. The memory array of claim 3 comprising the non-stoichiometric refractory metal nitride.
6. The memory array of claim 5 wherein the non-stoichiometric refractory metal nitride is metal-rich.
7. The memory array of claim 5 wherein the non-stoichiometric refractory metal nitride is metal-poor.
8. The memory array of claim 3 comprising the (1).
9. The memory array of claim 3 comprising the (2).
10. The memory array of claim 3 comprising the (3).
11. A memory array comprising strings of memory cells, comprising:
    a vertical stack comprising alternating insulative tiers and conductive tiers above a conductor tier, strings of memory cells comprising channel-material strings that extend through the insulative tiers and the conductive tiers, the conductor tier comprising upper conductor material directly above and directly against lower conductor material of different composition from that of the upper conductor material, the channel-material strings directly electrically coupling to the upper and lower conductor materials of the conductor tier; and
    a through-array-via (TAV) region comprising TAVs; the TAVs individually comprising the upper conductor material, the lower conductor material, and a conducting material that is directly below the conductor tier; the lower conductor material being directly against the conducting material, the lower conductor material comprising an upper portion and a lower portion that are directly against one another and individually comprise a refractory metal nitride; the refractory metal nitride of the lower portion being metal-rich, directly against the conducting material, and comprising more of the refractory metal than the upper portion.
12. The memory array of claim 11 wherein the refractory metal nitride comprises Ti.
13. The memory array of claim 11 wherein the lower conductor material comprises a metal silicide directly above the upper portion and that is directly against the upper conductor material.
14. The memory array of claim 13 wherein the metal silicide comprises $WSi_x$.
15. The memory array of claim 11 wherein the upper conductor material comprises conductively-doped semiconductive material at least in a memory array region where the channel-material strings extend through the insulative tiers and the conductive tiers.
16. The memory array of claim 15 wherein the conductively-doped semiconductive material comprises polysilicon.
17. The memory array of claim 11 further comprising an insulator tier that is directly under the channel-material strings and in the TAV region directly below the conductor tier, wherein the conducting material of the TAVs extend through the insulator tier to circuitry there-below.
18. A memory array comprising strings of memory cells, comprising:
    a vertical stack comprising alternating insulative tiers and conductive tiers above a conductor tier, strings of memory cells comprising channel-material strings that extend through the insulative tiers and the conductive tiers, the conductor tier comprising upper conductor material directly above and directly against lower conductor material of different composition from that of the upper conductor material, the channel-material strings directly electrically coupling to the upper and lower conductor materials of the conductor tier; and
    a through-array-via (TAV) region comprising TAVs; the TAVs individually comprising the upper conductor material, the lower conductor material, and a conducting material that is directly below the conductor tier; the lower conductor material being directly against the upper conductor material and directly against the conducting material, the lower conductor material comprising a refractory metal nitride directly above and directly against an elemental metal or an alloy of at least two elemental metals, the elemental metal or the alloy being directly against the conducting material.

19. The memory array of claim 18 wherein the elemental metal or the alloy of at least two elemental metals comprises Ti.

20. The memory array of claim 18 wherein the refractory metal nitride is stoichiometric.

21. The memory array of claim 18 wherein the refractory metal nitride is non-stoichiometric.

22. The memory array of claim 18 wherein the lower conductor material comprises the elemental metal which is directly against the conducting material and the refractory metal nitride.

23. The memory array of claim 18 wherein the lower conductor material comprises the alloy of at least two elemental metals which is directly against the conducting material and the refractory metal nitride.

24. The memory array of claim 18 wherein the refractory metal nitride comprises TiN.

25. The memory array of claim 18 wherein the lower conductor material comprises:
a metal silicide;
TiN below the metal silicide; and
elemental Ti or an alloy comprising Ti below the TiN.

26. The memory array of claim 18 wherein:
the upper conductor material comprises conductively-doped polysilicon at least in a memory array region where the channel-material strings extend through the insulative tiers and the conductive tiers;
the lower conductor material comprises a metal silicide directly above the refractory metal nitride and that is directly against the conductively-doped polysilicon; and
the conducting material comprises a metal material.

27. A memory array comprising strings of memory cells, comprising:
a vertical stack comprising alternating insulative tiers and conductive tiers above a conductor tier, strings of memory cells comprising channel-material strings that extend through the insulative tiers and the conductive tiers, the conductor tier comprising upper conductor material directly above and directly against lower conductor material of different composition from that of the upper conductor material, the channel-material strings directly electrically coupling to the upper and lower conductor materials of the conductor tier; and
a through-array-via (TAV) region comprising TAVs; the TAVs individually comprising the upper conductor material, the lower conductor material, and a conducting material that is directly below the conductor tier; the lower conductor material being directly against the upper conductor material and directly against the conducting material, the lower conductor material comprising metal-rich refractory metal nitride of constant refractory metal content that is directly against the upper conductor material and the conducting material.

28. A method used in forming a memory array comprising strings of memory cells, comprising:
forming conducting material of lower parts of through-array-vias (TAVs) in a TAV region;
forming a conductor tier that is in both a memory array region and the TAV region, the conductor tier comprising lower conductor material directly above and directly against the conducting material of the lower parts of the TAVs, the lower conductor material comprising at least one of (a) and (b), where,
(a): a metal-rich refractory metal nitride; and
(b): a stoichiometric or non-stoichiometric refractory metal nitride directly above and directly against one of (1), (2), or (3), where:
(1): an elemental metal;
(2): an alloy of at least two elemental metals; and
(3): a metal-rich refractory metal nitride of different composition from that of the stoichiometric or non-stoichiometric refractory metal nitride;
the conductor tier comprising an upper conductor material directly above and directly against the lower conductor material, the lower parts of the TAVs individually comprising the upper conductor material, the lower conductor material, and the conducting material;
forming a vertical stack comprising alternating different-composition first tiers and second tiers directly above the conductor tier in the memory array region and the TAV region;
forming channel-material strings through the vertical stack in the memory array region and that directly electrically couple to the upper and lower conductor materials of the conductor tier; and
forming upper parts of the TAVs through the vertical stack in the TAV region and that individually directly electrical couple to individual of the lower parts of the TAVs.

29. The memory array of claim 27 wherein the metal-rich refractory metal nitride of constant refractory metal content comprises Ti.

30. The memory array of claim 27 wherein the lower conductor material comprises a metal silicide directly above the metal-rich refractory metal nitride.

31. The memory array of claim 30 wherein the metal silicide is directly against the upper conductor material.

32. The memory array of claim 27 wherein:
the upper conductor material comprises conductively-doped semiconductive material at least in a memory array region where the channel-material strings extend through the insulative tiers and the conductive tiers; and
the lower conductor material comprises both a metal silicide and the metal-rich refractory metal nitride of constant refractory metal content.

33. The memory array of claim 32 wherein the conductively-doped semiconductive material comprises polysilicon.

34. The method of claim 28 comprising the (a).

35. The method of claim 28 comprising the (b).

36. The method of claim 35 comprising the stoichiometric refractory metal nitride.

37. The method of claim 35 comprising the non-stoichiometric refractory metal nitride.

38. The method of claim 37 wherein the non-stoichiometric refractory metal nitride is metal-rich.

39. The method of claim 37 wherein the non-stoichiometric refractory metal nitride is metal-poor.

40. The method of claim 35 comprising the (1).

41. The method of claim 35 comprising the (2).

42. The method of claim 35 comprising the (3).

* * * * *